United States Patent [19]
Yamamoto et al.

[11] Patent Number: 6,150,076
[45] Date of Patent: *Nov. 21, 2000

[54] PROCESS FOR TREATING PERIPHERY OF UNEXPOSED PHOTOSENSITIVE RESIN PLATE

[75] Inventors: Katsumasa Yamamoto; Takamitsu Ariki; Kosaku Onodera; Masaru Nampei, all of Ohtsu, Japan

[73] Assignee: Toyo Boseki Kabushiki Kaisha, Osaka, Japan

[ * ] Notice: This patent is subject to a terminal disclaimer.

[21] Appl. No.: 07/839,173

[22] Filed: Feb. 19, 1992

[30] Foreign Application Priority Data

Feb. 21, 1991 [JP] Japan ..................................... 3-049106

[51] Int. Cl.⁷ ............................... G03C 5/00; B41M 5/00
[52] U.S. Cl. .......................... 430/327; 430/300; 430/302; 430/306; 430/394; 430/494; 101/467
[58] Field of Search ..................................... 430/327, 300, 430/494, 306, 394, 302; 101/467

[56] References Cited

U.S. PATENT DOCUMENTS

| 3,859,091 | 1/1975 | Wessells et al. | 430/327 |
| 3,867,153 | 2/1975 | MacLachlan | 430/5 |
| 4,857,437 | 8/1989 | Banks et al. | 430/494 |
| 4,946,752 | 8/1990 | Tomita et al. | 430/306 |

FOREIGN PATENT DOCUMENTS

| 0017927 | 10/1980 | European Pat. Off. | 430/306 |
| 0 068 599 | 2/1983 | European Pat. Off. | |
| 0 398 325 | 11/1990 | European Pat. Off. | |
| 2 297 872 | 8/1976 | France . | |
| 2 823 300 | 12/1979 | Germany . | |
| 58-139144 | 8/1983 | Japan | 430/327 |
| 2-46935 | 10/1990 | Japan . | |
| 3-72353 | 3/1991 | Japan . | |

OTHER PUBLICATIONS

Patent & Trademark Office English Translation of Japanese Patent 58–139144 (pub Aug. 18, 1983).

Webster's New World Dictionary, 3rd College Edition (1988) p. 1449.

Ono, Kiyoshi et al., "Surface treatment of sealants," Chemical Abstracts, Abstract No. 193 645x, vol. 113, No. 22, Nov. 26, 1990.

*Primary Examiner*—Mark Chapman
*Attorney, Agent, or Firm*—Leydig, Voit & Mayer, Ltd.

[57] ABSTRACT

A process for treating the periphery of an unexposed photosensitive resin plate, which comprises irradiation of light having a wavelength of not longer than 300 nm on the periphery of the unexposed photosensitive resin plate until the periphery is free of stickiness. The process of the present invention solves problems such as sticking of the peripheral resin of unexposed plates to packages, sticking of unexposed resin to a working table, exposure table or vacuum adhesion sheet, sticking of dust, and so on on the periphery of unexposed plates, and sticking of unexposed resin to hands when handling, while eliminating all defects in handling during the steps of making printing plates.

9 Claims, No Drawings

PROCESS FOR TREATING PERIPHERY OF UNEXPOSED PHOTOSENSITIVE RESIN PLATE

BACKGROUND OF THE INVENTION

The present invention relates to a process for treating the periphery of an unexposed photosensitive resin plate. More specifically, the present invention relates to a process for removing the stickiness of the periphery of an unexposed photosensitive resin plate.

While the production of printing plates from photosensitive resin plates generally includes steps of exposing, washing out, drying, post-exposing, etc, a step for handling unexposed photosensitive resin plates exists before the exposing step. The said step for handling unexposed plates means taking out unexposed plates from packing cases, cutting them according to the size of negative film, printing images on an exposing table, and so on. In the presence of stickiness on the periphery of unexposed plates, the smooth processing of these steps will be prevented, giving rise to inconveniences in handling. The periphery here means the sides of an unexposed plate and is resin surfaces externally bare. For example, the periphery of an unexposed plate sticks to a package or cushion sheet during its removal from a packing case, the periphery of an unexposed plate sticks to a cutting table while the plate is being cut, and the periphery of an unexposed plate sticks to an exposing table or vacuum adhesion sheet during exposing. In addition, problems such as dust deposition on the periphery of unexposed plates, and stickiness of unexposed resin to hands during handling of plates occur, for which reasons a process for removing the stickiness of the periphery of an unexposed plate is desired.

In order to solve these problems, there have been proposed methods including a method in which an inorganic powder is deposited on the periphery of an unexposed plate to remove the surface stickiness, a method in which the periphery of an unexposed plate is covered with a non-adhesive sheet such as release paper, and so on. Of those, the method in which an inorganic powder is deposited on the periphery of an unexposed plate to prevent the stickiness of the surfaces requires a complicated manipulation of the steps for the deposit of the powder, and is of no practical use since it may produce unsatisfactory image quality in the steps of making printing plates, such as exposing, because of the powder deposited on the surfaces of the plate; and the method in which the periphery of an unexposed plate is covered with a non-adhesive sheet such as release paper is of no practical use either, since even if the method could prevent the peripheral resin of the unexposed plate from sticking to the package or cushion sheet, the peripheral resin of the unexposed plate can stick to an exposing table, vacuum adhesion sheet, and to hands during the exposing step.

When the photosensitive resin composition is a photosensitive elastomer containing a conjugated diene polymer, there is practically no appropriate methods in the conventional methods, since the resin of such composition is softer and stronger in stickiness. Accordingly, the present invention aims at developing an easy and effectively practical process for removing the stickiness of the peripheral resin of an unexposed photosensitive resin plate, which causes no problem during making printing plates.

SUMMARY OF THE INVENTION

The present inventors have made intensive studies for the purpose of developing a process for removing the stickiness of the peripheral resin of an unexposed photosensitive resin plate, whereby to improve the present situation, and found that an irradiation of light having a wavelength of 300 nm or below on the peripheral resin of the unexposed plate accomplishes the removal of the stickiness, and completed the present invention. That is, the present invention relates to a process for removing the stickiness of the periphery of an unexposed photosensitive resin plate, which comprises irradiation of light having a wavelength of not more than 300 nm on the periphery of an unexposed photosensitive resin plate until it is free of stickiness.

DETAILED DESCRIPTION OF THE INVENTION

The photosensitive resin plate to be used in the present invention is exemplified by those composed of a polyamide photosensitive resin with, as an essential component, a polyamide which can dissolve or swell in solutions for washing out, such as water, aqueous solutions of alkali, and alcohols, those made of a polyvinyl alcohol photosensitive resin with polyvinyl alcohol as an essential component, those made of a polyester photosensitive resin with, as an essential component, a polyester containing a low molecular unsaturated group, those made of an acrylic photosensitive resin with an acrylic low molecular polymer as an essential component, and those made of a polyurethane photosensitive resin with polyurethane as an essential component. These photosensitive resins are imparted with photocurability by the addition of photopolymerizable unsaturated monomer, photosensitizer, etc.

Recently, there have been proposed photosensitive flexo plates which allow developing in an aqueous washing solution from the viewpoints of toxicity and safety. Examples thereof include those containing a copolymer of a conjugated diene hydrocarbon and α, β-ethylenically unsaturated carboxylic acid or its salt as essential components, and a mono-olefin unsaturated compound, those containing a copolymer of a conjugated diene hydrocarbon polymer or a conjugated diene hydrocarbon, and a mono-olefin unsaturated compound, those containing a photosensitive elastomer composition containing a hydrophilic polymer compound and a non-gaseous ethylenically unsaturated compound, those containing a hydrophobic oligomer containing an α, β-ethylenically unsaturated group, and those containing an elastomer and a substance which can swell in water. All of these are imparted with photocurability by the addition of photopolymerizable unsaturated monomers, photosensitizers, and so on. While there are many examples of photosensitive resin to be used in the present invention, particularly preferred are those containing a hydrophobic polymer and a hydrophilic polymer which have a strong cohesiveness.

The present invention is preferably applied in particular to a photosensitive resin composition containing a polymer which can be dissolved or swollen in water or an aqueous developer, an ethylenically unsaturated monomer and/or a hydrophobic polymer, and a photoinitiator. For example, such a composition is disclosed in Japanese Unexamined Patent Publication Nos. 211451/1985 and 173055/1985.

Besides the above-mentioned photosensitive resin composition, examples thereof include those containing (A) a hydrophobic polymer having a glass-transition temperature not higher than 5° C. and (B) a hydrophilic polymer, particularly those containing particles having a phase composed mainly of component (A) and a phase composed mainly of component (B) in dispersion; those containing the aforementioned component (A), component (B), (C) an ethylenically unsaturated compound, (D) a solvent in which the solubility (by weight) of component (B) is greater than that of component (A), and (E) a photoinitiator; and those characterized in that particles containing a first phase. composed mainly of a hydrophobic polymer which is surrounded by a second phase composed mainly of a hydrophilic polymer are present as a dispersed phase in the photosensitive resin layer. These compositions are particularly preferred in the present invention.

The hydrophobic polymer having a glass-transition temperature not higher than 5° C. as the above-described component (A) includes those which are used as general-purpose elastomers, examples of which are polymers obtained by the polymerization of a conjugated diene hydrocarbon, copolymers obtained by the copolymerization of a conjugated diene hydrocarbon with a mono-olefinically unsaturated compound, and polymers containing no conjugated diene hydrocarbons. As the conjugated diene hydrocarbon, 1,3-butadiene, isoprene, and chloroprene can be used alone or in combination with one another.

As the mono-olefinically unsaturated compound, for example, styrene, alpha-methylstyrene, o-methylstyrene, m-methylstyrene, p-methylstyrene, acrylonitrile, methacrylonitrile, vinyl chloride, vinylidene chloride, acrylamide, methacrylamide, vinyl acetate, acrylic esters, and methacrylic esters can be used.

Examples of the polymers obtained by the polymerization of a conjugated diene hydrocarbon and of the copolymers obtained by the copolymerization of a conjugated diene hydrocarbon with a mono-olefinically unsaturated compound include butadiene polymers, isoprene polymers, chloroprene polymers, styrene-butadiene copolymers, styrene-isoprene copolymers, styrene-chloroprene copolymers, acrylonitrile-butadiene copolymers, acrylonitrile-isoprene copolymers, acrylonitrile-chloroprene copolymers, methyl methacrylate-butadiene copolymers, methyl methacrylate-isoprene copolymers, methyl methacrylate-chloroprene copolymers, methyl acrylate-butadiene copolymers, methyl acrylate-isoprene copolymers, methyl acrylate-chloroprene copolymers, acrylonitorile-isoprene-styrene copolymers, and acrylonitrile-chloroprene-styrene copolymers.

Examples of the polymers containing no conjugated diene hydrocarbons include elastomers containing a specific amount of chloride and polymers of non-conjugated diene hydrocarbons.

The hydrophobic polymer having a glass-transition temperature (hereinafter referred to as Tg) not higher than 5° C. contains 10 to 50 wt % of chlorine and exhibits rubber elasticity. Such a hydrophobic polymer can be obtained, for example, by the polymerization of a chlorine-containing monomer or by the copolymerization of a chlorine-containing monomer and other copolymerizable monomers. Alternatively, it can also be obtained by the reaction of a chlorine-free polymer with chlorine or a chlorine-containing active substance. Examples of this polymer include epichlorohydrin polymers, epichlorohydrin-ethylene oxide copolymers, epichlorohydrin-propylene oxide copolymers, epichlorohydrin rubber containing allyl glycidyl ether (commercially available under the trade name of "Epichlomar" from Osaka Soda Kogyo Co., Ltd., "Hydrin" from Goodrich Co., Ltd., "Gechron" or "Zeospan" from Nippon Zeon Co., Ltd., and "Herclor" from Hercules Co., Ltd.), chlorinated polyethylene (commercially available under the trade name of "Elaslen" from Showa Denko Co., Ltd., "Daisolac" from Osaka Soda Kogyo Co., Ltd., "Hortalitz" from Hoechst Co., Ltd., and "Dowcpe" from Dow Chemical Co., Ltd.), vinyl chloride copolymers, vinylidene chloride, chlorinated polyethylene, and chlorinated ethylene-propylene rubber.

These polymers can be used alone or in combination with one another. The chlorine content in the polymer should be 10 to 50 wt %, and preferably 15 to 40 wt %. With a chloride content outside this range, the flexibility and heat stability of the polymer are decreased, so that a photosensitive resin composition prepared therefrom is excessively hard and readily colored.

Moreover, the chlorine-containing polymers or copolymers of conjugated diene hydrocarbons have some carbon unsaturated bonds in the main chain, so that they are inferior in chemical stability, such as weathering, to polymers having saturated bonds only.

The photosensitive resin composition may change in its physical properties after exposure to light, and the change depends greatly upon the properties of component (A). It is, therefore, preferred that component (A) be a rubber elastic material. Thus, component (A) should have a Tg not higher than 5° C., and it is particularly preferred that component (A) has a Tg not higher than −10° C.

In the photosensitive resin composition, for example, an elastomer such as acrylic rubber and a polyurethane-type elastomer, which is highly miscible with the polymer as component (A) and has good ozone resistance, may also be contained in the form of a blend with this polymer.

The content of component (A) in the photosensitive resin composition is 20 wt % or more, and preferably 30 wt % or more, from the viewpoint of physical properties and shape retention of printing plates prepared from this composition. Also, the content of component (A) is not more than 80 wt %, and preferably not more than 70 wt %, from the viewpoint of photopolymerizability.

The hydrophilic polymer as the above-described component (B) refers to a polymer which is dissolved or swollen (dispersed) in water or a developer composed mainly of water and containing an aqueous alkaline or acid solution, an organic solvent, a surfactant, and the like. The hydrophilic polymer has a hydrophilic group such as —$CO_2M$, —$SO_3M$ (where M denotes a hydrogen atom, an element of Group I, II, or III, an amine, or an ammonium ion), —$NH_2$, and —OH, and is of the straight-chain structure having no cross-linkage.

Examples of the hydrophilic polymer include general-purpose resins such as polyvinyl alcohol (PVA) and carboxymethyl cellulose, diene-type rubber obtained by the copolymerization of (meth)acrylic acid with a diene compound, and liquid polybutadiene modified with maleic anhydride. Preferred is a polymer with a particularly effective skeleton having —COOM groups (where M denotes a hydrogen atom, an element of Group I, II, or III, an amine, or an ammonium ion) in an amount of 50 to 50,000 equivalents/$10^6$ g. Examples of the element of Group I, II, or III, as denoted by symbol M, include alkali metals such as sodium, potassium, and lithium; alkaline earth metals such as calcium and magnesium; boron, and aluminum. With an amount of —COOM groups less than 50 equivalents/$10^6$ g, the hydrophilic polymer has a decreased affinity for water, thereby making it difficult to conduct the development with neutral water. With an amount in excess of 50,000 equivalents/$10^6$ g, the resulting finished printing plate can readily be degraded by aqueous ink, in other words, it has decreased resistance to aqueous ink.

As the hydrophilic polymer, for example, —COOM group-containing polyurethanes, —COOM group-containing polyurea urethanes, —COOM group-containing polyesters, —COOM group-containing epoxy compounds, —COOM group-containing polyamide acids, —COOM group-containing acrylonitrile-butadiene copolymers, —COOM group-containing styrene-butadiene copolymers, —COOM group-containing polybutadienes, polyacrylamide, sodium polyacrylate, polyvinyl alcohol (PVA), carboxylmethyl cellulose (CMC), hydroxyethyl cellulose (HEC), methyl cellulose (MC), polyethylene oxide, polyethylene imine, and derivatives of these compounds can be used, but the hydrophilic polymer is not limited thereto.

As a compound which is used to neutralize at least a part of the carboxyl groups contained in the above-described hydrophilic polymer, alkali metal hydroxides such as lithium hydroxide, potassium hydroxide, and sodium hydroxide; alkali metal carbonates such as lithium carbonates, potassium carbonates, and sodium carbonates; alkali metal alkoxides such as potassium t-butoxide and sodium methoxide; polyvalent metal hydroxides such as calcium hydroxide, magnesium hydroxide, and aluminum hydroxide; polyvalent metal alkoxides such as aluminum isopropoxide; tertiary amines such as triethylamine and tri-n-propylamine; secondary amines such as diethylamine and di-n-propylamine; primary amines such as ethylamine and n-propylamine; cyclic amines such as morpholine; amino group-containing (meth)acrylates such as N,N-dimethylaminoethyl-(meth) acrylate and N,N-diethylaminoethyl(meth)acrylate; ammonium salts such as ammonium carbonate, and the like can be used alone or in combination with one another.

The above-described hydrophilic polymer may contain, in addition to —COOM groups, polyalkylene chains as the hydrophilic moiety and ethylenically unsaturated groups so that the polymer can function as a cross-linking agent.

In the photosensitive resin composition, for example, a polymer having hydrophilic groups such as hydroxyl groups, amino groups, and sulfone groups, and/or polyoxyalkylene chains may be used in combination with the hydrophilic polymer as component (B).

The content of component (B) in the photosensitive resin composition is 5 to 50 wt %, preferably 7 to 40 wt %, and more preferably 7 to 30 wt %, from the viewpoint of aqueous developability and resistance to aqueous ink. It is essential that the content of component (B) in the photo-sensitive resin composition be smaller than that of component (A); otherwise, the resulting finished printing plate has decreased resistance to aqueous ink.

The ethylenically unsaturated compound as component (C) has at least one terminal ethylenic group. This compound can form a high-molecular polymer through the addition polymerization by chain propagation, which is initiated by a free radical. Suitable ethylenically unsaturated compound is an unsaturated ester of polyols, and particularly an unsaturated ester of polyols with alpha-methylenecarboxylic acid, examples of which are ethylene glycol di(meth)acrylate, diethylene glycol di(meth)acrylate, glycerol diacrylate, 1,3-propanediol di(meth)-acrylate, 1,4-butanediol di(meth)acrylate, 1,2,4-butanetriol tri(meth) acrylate, 1,4-cyclohexanediol di(meth)acrylate, 1,6-hexanediol di(meth)acrylate, trimethylolpropane tri(meth) acrylate, diallyl phthalate, diethyl phthalate, and dibutyl maleate. Additional examples include N-substituted maleimide compounds such as N-methylmaleimide, N-ethylmaleimide, and N-laurylmale-imide, and oligo (meth)acrylates such as oligonitrile-butadiene di(meth) acrylate, oligonitrile-urethane (meth)acrylate, oligo-urethane di(meth)acrylate, oligobutadiene di(meth)acrylate, and oligobutadiene-urethane di(meth)acrylate. These compounds can be used alone or in combination with one another.

The content of component (C) in the photosensitive resin composition is preferably 1 to 50 wt %, and more preferably 5 to 40 wt %. With an amount of less than 1 wt %, the resin composition does not undergo satisfactory photopolymerization, thereby causing no formation of images after development. With an amount of more than 50 wt %, the resin composition has poor shape retention and is unsuitable for flexographic printing plates because it becomes hard and brittle after exposure to light.

The solvent as component (D), in which the solubility of component (B) is greater than that of component (A), may be a highly polar solvent, that is, a solvent which can swell, disperse, and dissolve a hydrophilic polymer as component (B) but has a smaller swellability of a hydrophilic polymer as component (A). Examples of such as solvent include water and alcohols having 1 to 5 carbon atoms.

When water is used, a surfactant such as sodium alkylbenzenesulfonate, sodium alkylnaphthalenesulfonate, sodium alkylsulphonate, and sodium alkylether sulfonate, a fatty acid, an alkali metal hydroxide such as lithium hydroxide, potassium hydroxide, and sodium hydroxide, and a salt thereof, such as sodium borate, sodium carbonate, sodium acetate, and magnesium acetate may be contained in this water.

Specific examples of the alcohol include methyl alcohol, ethyl alcohol, propyl alcohol, isopropyl alcohol, butyl alcohol, isobutyl alcohol, t-butyl alcohol, pentyl alcohol, and neopentyl alcohol.

Moreover, ester-type solvents, ketone-type solvents, and amido-type solvents can also be used, so long as these solvents meet the requirement of component (D). Specific examples thereof include ethyl acetate, butyl acetate, isobutyl acetate, methyl cellosolve, acetone, methyl ethyl ketone, methyl butyl ketone, formamide, dimethylformamide, and dimethylacetoamide. These solvents can be used alone or in combination with one another.

The content of component (D) in the photosensitive resin composition should be in the range of 0.001 to 5 wt %, and preferably 0.001 to 2.0 wt %, so as to obtain a satisfactory flexographic printing plate. With a content in excess of 5 wt %, a printing plate stock becomes soft and causes cold flow and plastic deformation before photopolymerization, which leads to the deformation of the convex portions of a relief (i.e., occurrence of low spots) after photopolymerization and plate making, thereby making it impossible to obtain sharp images.

Examples of the photopolymerization initiator as component (E) include benzophenone-type compounds, benzoin-type compounds, acetophenone-type compounds, benzyl-type compounds, benzoin alkyl ethers, benzyl alkyl ketals, anthraquinone-type compounds, and thioxanthone-type compounds. Specific examples thereof include benzophenone, chlorobenzophenone, benzoin, acetophenone, benzyl, benzoin, methyl ether, benzoin ethyl ether, benzoin isopropyl ether, benzoin isobutyl ether, benzyl dimethyl ketal, benzyl diethyl ketal, benzyl diisopropyl ketal, anthraquinone, 2-chloroanthraquinine, thioxanthone, and 2-chlorothioxanthone.

The content of component (E) in the photosensitive resin composition is preferably 0.01 to 5 wt %, and more preferably 0.1 to 3 wt %. With a content of less than 0.01 wt %, the resin composition cannot readily undergo photopolymerization. With a content in excess of 5 wt %, the resin composition itself prevents the penetration of light necessary for curing to a desired depth, in which case images are readily chipped off during development.

To prevent only the heat polymerization without suppressing the photo-crosslinking reaction, the photo-sensitive resin composition of the present invention may optionally contain, in addition to the above-described essential components (A) to (E), a heat polymerization inhibitor as component (F) in an amount of 0.001 to 5 wt %. Examples of the heat polymerization inhibitor which is useful for this purpose include hydroquinone, hydroquinone monoethyl ether, catechol, p-t-butyl catechol, and 2,6-di-t-butyl-p-cresol.

The photosensitive composition may also contain, as a plasticizer, a liquid rubber such as liquid polybutadiene rubber, liquid polyacrylonitrile-butadiene rubber, liquid polystyrene-butadiene rubber, and liquid isoprene rubber, relatively low molecular weight elastomer such as polyvinyl chloride, chlorinated polyethylene, and chlorinated polypropylene; a fine powder such as silica and diaromaceous earth, or the like.

Using the photosensitive resin composition as described above and the composition for the anti-tack layer (hereinafter referred to as anti-tack layer composition) of the present invention, printing plate stocks are produced, for example, as follows:

First, under the ordinary conditions, the above-described components of the photosensitive resin composition are dissolved in any order and mixed in an appropriate solvent or component (D), such as tetrahydrofuran, dioxane, methyl ethyl ketone, toluene cyclohexanone, chloroform, water, and alcohols, which can swell, disperse, and dissolve the hydrophilic polymer. After removal of the solvent, the remaining mixture is applied, with heating under pressure, to an appropriate support such as a polyester, polyethylene, or polypropylene film.

The light to be used for the irradiation on the peripheral resin of an unexposed photosensitive resin plate thus obtained has a wavelength of 300 nm or shorter, and preferably 200–300 nm. The irradiation of light having a wavelength not more than 200 nm is not desirable in that It generates ozone in the atmosphere. On the other hand, that of light having a wavelength of more than 300 cannot provide complete hardening by polymerization of the peripheral surfaces of unexposed resin or complete removal of stickiness therefrom. Examples of the light source which emits light having a wavelength not longer than 300 nm include a germicidal lamp, a deuterium lamp, and a low-pressure mercury lamp.

In the present invention, irradiation of light having a central wavelength of 254 nm, which is capable of removing the stickiness of the peripheral resin of unexposed photosensitive resin plates is normally carried out at an illuminance of 10–50 $W/m^2$, and preferably 25–35 $W/m^2$. The irradiation time is normally between 1 minute and 20 minutes, and preferably between 5 minutes and 15 minutes. An irradiation for a longer period such as for more than 20 minutes does not contribute to the removal of the stickiness of the peripheral resin any more than to a certain extent, but undesirably raises the temperature of the resin of unexposed plates. While this light irradiation for the treatment of periphery can be conducted both in the atmosphere and in an inert gas, no difference can be observed in the removal of stickiness. Thus, irradiation in the atmosphere is more advantageous.

Generally, irradiation of light on an unexposed photosensitive resin plate causes hardening of the resin constituting said resin plate, and as a result, development with water becomes unattainable. The process of the present invention, however, is capable of retaining water swelling rate which is an index of water developability, at 2 wt % or more, and exerts no adverse influence on the water developability.

The present invention is hereinbelow described in detail by illustrating working examples, to which the present invention is not limited. In the following examples, "part" means "part by weight".

EXAMPLE 1

A solution of hexamethylene diisocyanate (21.8 parts), dimethylolpropionic acid (15.4 parts), polytetramethylene glycol (PG-100, Nihon Polyurethane Kogyo, 7.6 parts) and di-n-butyltin dilaurate (1.0 part) in 300 parts of tetrahydrofuran was charged in a 1 l-flask equipped with a stirrer. The flask was heated to 65° C. while stirring, and the mixture was allowed to react for 3 hours. Acrylonitrile butadiene oligomer containing terminal amino (Hycar ATBNX 1300×16, from Ube Industries, Ltd., 55.3 parts) in 100 parts of methyl ethyl ketone prepared in another vessel was added in said 1 l-flask at room temperature while stirring. The polymer solution thus obtained was dried under reduced pressure to remove the tetrahydrofuran and methyl ethyl ketone, thereby to give a polymer having a number average molecular weight of 21000. To a solution of 100 parts of said polymer in 100 parts of methyl ethyl ketone was added lithium hydroxide (4.8 parts) in methyl alcohol (100 parts) at room temperature while stirring, and the mixture was further stirred for 30 minutes to give a hydrophilic polymer (I).

The above-mentioned hydrophilic polymer (I) (10 parts), and chlorinated polyethylene (H-135, from Osaka Soda Kogyo Co., Ltd., 45 parts), stylene butadiene rubber (JSR1507, from Japan Synthetic Rubber Co., Ltd., 15 parts), butadiene oligoacrylate (PB-A, from Kyoeisha Yushi, 28.5 parts), benzyl dimethyl ketal (Irgacure 651, from Chiba Geigy, 1 part) and hydroquinone monomethyl ether (0.5 part) as hydrophobic polymers were dissolved in toluene (40 parts) and water (10 parts), dispersed, mixed, kneaded and defoamed to give a photosensitive resin composition. The resin composition thus obtained was heated at 105° C. under pressure of 100 $kg/cm^3$ for 1 minute between a 125 $\mu$m-thick polyester film, and another polyester film same as above which had been coated with hydroxyethyl cellulose on one face thereof in a manner such that the hydroxyethyl cellulose layer contacted the photosensitive resin, to give a 2.8 mm-thick photosensitive resin plate.

The resin of the side of the thus-obtained photosensitive resin plate was sticky to an extent that a thin paper could easily stick thereto. Then, the surface of this plate was covered to avoid light, and the plate was exposed to light of a germicidal lamp having a central wavelength of 254 nm at an illuminance of 30 $W/m^2$ for not less than 5 minutes. As a result, the side surface stickiness was completely removed, and a thin paper could no longer stick thereto. A repeated irradiation of the same light on this plate caused no change of the side surface stickiness. This photosensitive resin plate applied with the peripheral treatment was kept in a shading bag to see the time course change, and it was found that the effect of the removal of the surface stickiness did not decrease in the atmosphere, and that an irradiation of light of an ultraviolet lamp having a central wavelength of 360 nm on this plate caused no change of the side surface stickiness. This plate was then processed to give a printing plate. No change of sensitivity inside the unexposed plate was induced by the removal of the stickiness of the side resin, which result indicated that only the stickiness of the surface of the side resin was effectively removed.

EXAMPLE 2

A photosensitive resin plate of the same composition as in Example 1 was prepared, and only the side resin was exposed to light of a germicidal lamp having a central wavelength of 254 nm in the atmosphere at an illuminance of 10 W/m² for 5 minutes, while covering the surface of the plate to avoid the light. As a result, the surface stickiness could not be completely removed. However, an irradiation for not less than 10 minutes afforded complete removal of the surface stickiness. With an irradiation of the same light at an illuminance of 40 W/m², the surface stickiness could be removed completely by 4 minutes' irradiation.

EXAMPLE 3

A photosensitive resin plate was prepared in the same manner as in Example 1 except the use of a styrene-butadiene-styrene block copolymer (Kraton 1101, from Shell Chemical Company) in place of chlorinated polyethylene, and only the side resin was exposed to light of a germicidal lamp having a central wavelength of 254 nm at an illuminance of 30 w/m² in the atmosphere for not less than 5 minutes, and thereby obtained was an unexposed photosensitive resin plate completely removed of the surface stickiness.

EXAMPLE 4

A photosensitive resin plate was prepared in the same manner as in Example 1 except the use of epichlorohydrin rubber (Epichlomer H, from Osaka Soda Kogyo Co., Ltd.) in place of chlorinated polyethylene, and only the side resin was exposed to light of a germicidal lamp having a central wavelength of 254 nm at an illuminance of 30 W/m² in the atmosphere for not less than 5 minutes, and thereby obtained was an unexposed photosensitive resin plate completely removed of the surface stickiness.

Comparative Example 1

A photosensitive resin plate having the same composition as in Example 1 was prepared, and only the side resin was exposed to light of an ultraviolet lamp having a central wavelength of 360 nm at an illuminance of 90 W/m² for not less than 5 minutes, while covering the surface of the plate to avoid the light. As a result, the surface stickiness could not be removed at all.

Water Swelling Rate

Water swelling was measured in the following way. That is, the periphery of unexposed photosensitive resin plates of Examples 1–4 and Comparative Example 1 were respectively exposed to light at various illuminations and for periods as in Examples 1–4 and Comparative Example 1, after which a test piece (5 cm×2 cm×1 mm) therefrom was immersed in water maintained at 20° C., and water swelling (wt %) was estimated based on the increase of the weight of the piece after 24 hours.

The obtained water swelling ratio are tabulated in Table 1.

TABLE 1

|  | illuminance, wavelength | irradiation time | water swelling (wt %) |
| --- | --- | --- | --- |
| Example 1 | 30 W/m² | 5 min. | 2.5 |
| Example 2 | 10 W/m² | 5 min. | 2.8 |
| Example 2 | 10 W/m² | 10 min. | 2.6 |
| Example 2 | 40 W/m² | 4 min. | 2.5 |
| Example 3 | 30 W/m² | not less than 5 min. | 2.6 |
| Example 4 | 30 W/m² | not less than 5 min. | 2.5 |
| Com. Ex. 1 | 360 nm, 90 W/m² | not less than 5 min. | 0.8 |

The process of the present invention comprising the aforementioned steps is easily conducted and is effectively practical for removing the stickiness of the peripheral resin of unexposed photosensitive resin plates. The present invention provides a solution to the problems such as sticking of the peripheral resin of unexposed plates to packages, sticking of unexposed resin to a working table, exposing table or vacuum adhesion sheet, sticking of dust, and so on on the periphery of unexposed plates, and sticking of unexposed resin to hands while handling, thereby eliminating all defects in handling during the steps of making printing plates. In addition, the process of the invention prevents occurrence of cold flow, while retaining the properties as an unexposed plate.

What is claimed is:

1. A process for treating the periphery of a photosensitive resin plate that has not been previously irradiated with light, wherein said plate comprises a photocurable resin comprising (1) a polyamide, a polyvinyl alcohol, a polyester, an acrylic polymer, or a polyurethane, (2) a photopolymerizable unsaturated monomer and (3) a photosensitizer, which comprises irradiation with light having only a wavelength below 300 nm on only the periphery of the unexposed photosensitive resin plate until the periphery is free of stickiness without impairing resin photosensitivity.

2. A process according to claim 1, wherein the resin plate, after exposure, has a water swelling ratio of not less than 2 wt % after irradiation.

3. A process according to claim 1, wherein the photosensitive resin composition further comprises (A) a hydrophobic polymer having a glass-transition temperature not higher than 5° C., and (b) a hydrophilic polymer.

4. A process according to claim 1, wherein the photosensitive resin composition further comprises (A) a hydrophobic polymer having a glass-transition temperature not higher than 5° C., (B) a hydrophilic polymer, and a solvent in which the solubility of component (B) is greater than that of component (A).

5. A process according to claim 1, wherein the photosensitive resin plate contains particles having a phase composed of a hydrophobic polymer and a phase composed of a hydrophilic polymer.

6. A process according to claim 5, wherein the particles containing a phase composed of a hydrophobic polymer which is surrounded by a phase composed of a hydrophilic polymer are present as a dispersed phase in the photosensitive resin plate.

7. A process according to claim 1, wherein the irradiation of light is conducted for 5–15 minutes at an illuminance of 10–50 W/m².

8. The process of claim 1 wherein the resin plate which has not been previously irradiated with light and comprises a photocurable resin comprising a photopolymerizable unsaturated monomer and a photopolymerization initiator, which process comprises irradiation with light having a wavelength not more than 300 nm only on the periphery of the unexposed photosensitive resin plate until the periphery is free of stickiness without impairing the photosensitvity of the photocurable resin.

9. The process of claim 8 wherein the photocurable resin further comprises (A) a hydrophobic polymer having a glass transition temperature not higher than 5 degrees C., (B) a hydrophilic polymer, (C) an ethylenically unsaturated compound, (D) a solvent in which the solubility of component (B) is greater than that of component (A) and (E) a photopolymerization initiator.

* * * * *